(12) United States Patent
Teh et al.

(10) Patent No.: US 7,205,209 B2
(45) Date of Patent: Apr. 17, 2007

(54) FABRICATION OF STACKED DIELECTRIC LAYER FOR SUPPRESSING ELECTROSTATIC CHARGE BUILDUP

(75) Inventors: Chai-Tak Teh, Luchou (TW); Min-Nin Yu, Dajia Township, Taichung County (TW); Gary Yang, Jhubei (TW); Han-Chung Chen, Baoshan Township, Hsinchu County (TW); Yuan-Shin Jing, Longjing Township, Taichung County (TW); Jian-Liang Lin, Cihtong Township, Yunlin County (TW); Jui-Feng Jao, Toufen Township, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 266 days.

(21) Appl. No.: 10/842,971

(22) Filed: May 11, 2004

(65) Prior Publication Data

US 2005/0255704 A1  Nov. 17, 2005

(51) Int. Cl.
*H01L 21/331* (2006.01)

(52) U.S. Cl. .................... 438/433; 438/618; 438/622; 438/435

(58) Field of Classification Search ........ 438/618–622, 438/433–435, 519, 527, 548; 257/758
See application file for complete search history.

(56) References Cited

U.S. PATENT DOCUMENTS

| 5,605,859 | A | | 2/1997 | Lee | |
|---|---|---|---|---|---|
| 5,741,740 | A | | 4/1998 | Jang et al. | 438/435 |
| 5,786,278 | A | | 7/1998 | Fry | 438/787 |
| 6,159,842 | A | * | 12/2000 | Chang et al. | 438/622 |
| 6,265,321 | B1 | * | 7/2001 | Chooi et al. | 438/725 |
| 6,531,377 | B2 | | 3/2003 | Knorr et al. | 438/435 |
| 2003/0132430 | A1 | * | 7/2003 | Tsai | 257/2 |

* cited by examiner

*Primary Examiner*—Dung A. Le
(74) *Attorney, Agent, or Firm*—Thomas, Kayden, Horstemeyer & Risley

(57) ABSTRACT

A method of fabricating a stacked dielectric layer for suppressing electrostatic charge buildup. First, a substrate having metal layers thereon is provided, with a plurality of gaps formed therebetween. Next, a dielectric layer is formed by simultaneous deposition and ion-bombardment, such that the dielectric layer covers the bottom dielectric liner and fills the gaps. Finally, a top dielectric liner is formed on the dielectric layer by deposition without ion-bombardment. Furthermore, the present invention provides another method to fabricate a stacked dielectric layer by performing a plasma treatment on the dielectric layer to suppress electrostatic charge buildup. As a result, the above-mentioned methods can efficiently avoid metal extrusion issues.

8 Claims, 5 Drawing Sheets

FABRICATION OF STACKED DIELECTRIC LAYER FOR SUPPPRESSING ELECTROSTATIC CHARGE BUILDUP

BACKGROUND OF THE INVENTION

1. Field of the Invention

The present invention relates to a semiconductor manufacturing process and in particular to a method of fabricating a dielectric layer suppressing electrostatic charge buildup.

2. Description of the Related Art

Semiconductor technology employs dielectric layers for electrical isolation and separation of conductive layers interconnecting circuits within microelectronic fabrication. When multiple levels of conductor layers are required to interconnect the high density of devices currently being fabricated within a semiconductor device, their separation is accomplished by inter-level metal dielectric (IMD) layers. Silicon oxide-containing dielectric materials may be formed into inter-level metal dielectric (IMD) layers useful in semiconductor technology by chemical vapor deposition (CVD). Many ways of forming a dielectric layer with good properties for certain purposes are widely sought.

For example, Lee, in U.S. Pat. No. 5,605,859, discloses a method for forming a dielectric layer over a polysilicon resistor layer on a glasseous dielectric layer while employing plasma enhanced chemical vapor deposition (PECVD) from silane to form a silicon oxide dielectric layer. The silicon oxide layer is deposited partly over the glasseous layer.

Further, Jang et al., in U.S. Pat. No. 5,741,740, disclose a method for forming a dielectric layer for shallow trench isolation (STI) wherein a conformal silicon oxide layer is first formed in the trench employing silane in a PECVD process, and then a gap filling silicon oxide is formed over the trench and conformal first silicon oxide layer employing SACVD in $O_3$-TEOS.

Still further, Fry, in U.S. Pat. No. 5,786,278, discloses a method for changing the tensile stress in a dielectric layer formed employing O.sub.3-TEOS in a SACVD process with compressive stress. The method employs exposure of the silicon oxide dielectric layer to pressures above atmospheric pressure at temperatures below the stress conversion temperature for the dielectric layer at atmospheric pressure to bring about the conversion of stress.

As the number of devices that may be included on a single semiconductor chip increases, the size of the device is reduced, as is the thickness of the photoresist layer. As well, the aspect of the gap between metal layers increases. In particular, silicon oxide dielectric layers formed by high density plasma chemical vapor deposition (HDPCVD) methods are well suited for these purposes because of the strong physical and electrical properties thereof. High density plasma chemical vapor deposition provides ion-bombardment for etching the sidewalls of the gaps during deposition, such that the deposited dielectric film forms quicker vertically. Thus, the gap-filling properties of the silicon oxide dielectric layer deposited by high density plasma chemical vapor deposition (HDPCVD), as used for IMD, are optimal.

Shufflebotham et al., in U.S. Pat. No. 6,531,377, disclose a method of high density plasma CVD gap-filling. The method comprises depositing a film of $SiO_2$ in gaps with widths less than 0.5 μm and aspect ratios exceeding 1.5:1 on a substrate, generating plasma in a process chamber by energizing gas containing silicon, oxygen and a heavy noble gas such as xenon or krypton.

Moreover, Knorr et al., in U.S. Pat. No. 6,531,377, disclose a method for high aspect ratio gap fill using sequential HDPCVD. In the HDPCVD process, a anisotropic dielectric layers are deposited as required for the particular aspect ratio of the trench, in order to fill the trench completely without voids within the trench dielectric material. However, metal extrusion issue may be produced in the dielectric layers deposited by high density plasma chemical vapor deposition (HDPCVD).

As shown in FIG. 1, a patterned metal layer 102 is formed on the substrate 100. Next, a liner dielectric layer 106 is comformally formed on the mater layer 102 and the substrate 100. Next, a dielectric layer 108 is deposited on the liner dielectric layer 106 to fill gaps between the patterned metal layer 102 and the substrate 100. Due to residual bombardment ions and interrupted bonds in the dielectric layer 108 a number of charges, however, a number of charges, such as fixed charges, defect charges, or dangling bonds, are produced in the dielectric layer 108 deposited by high density plasma chemical vapor deposition (HDPCVD). In order to remove particles from the surface of the dielectric layer 108, water scrubbing S100 using jet scrubber equipment to jet distilled water incident at about 3~6° is proposed. A large number of electrostatic charges induced by the friction between water and the HDPCVD dielectric layer 108 are, however, excessive, resulting in metal extruding from underlying metal layers to the dielectric layer, observable by scanning electron microscope (SEM). The electrostatic charges promote metal extrusion 106a from the metal layer 102 to the dielectric layer 108. The larger the electrostatic charge, the more serious the metal extrusion.

SUMMARY OF THE INVENTION

Accordingly, an object of the invention is to provide a method of fabricating a stacked dielectric layer for suppressing electrostatic charge buildup, such that metal extrusion does not occur as a result of water scrubbing to remove particles from the surface of the dielectric layer.

One aspect of the present invention is the use of a top dielectric liner comformally covering the dielectric layer. The top dielectric formed by deposition without ion-bombardment provides a less charged surface, so as to suppress electrostatic charges during subsequent water scrubbing.

Another aspect of the present invention is the application of a plasma treatment on the dielectric layer to eliminate fixed charges, defect charges, or dangling bonds when the pitch of each gap is less than 0.15 μm.

To achieve the above objects, the present invention provides a method of fabricating a stacked dielectric layer for suppressing electrostatic charge buildup. First, a substrate having metal layers thereon is provided, with a plurality of gaps formed therebetween. Next, a dielectric layer is formed to cover the metal layers and fill the gaps. Finally, the dielectric layer is implanted with ions or charges to suppress electrostatic charge buildup before or after removing particles from the surface of the dielectric layer by water scrubbing.

In accordance with the present invention, the dielectric layer comprises fluorinated silica glass (FSG).

In accordance with the present invention, the dielectric layer can be implanted with ions or charges by a plasma treatment, wherein the plasma treatment can comprise nitrogen, oxygen, nitrous oxide, helium, neon, argon, krypton, xenon, or radon plasma treatment at a flow rate of about 300~500 sccm. The plasma treatment can be applied by a source power of about 20~500 W and a bias power of about 0~500 W at a chamber pressure of about 2~10 torr for about 5~60 seconds.

To achieve the above objects, the present invention further provides another method of fabricating a stacked dielectric layer for suppressing electrostatic charge buildup when the pitch of each gap exceeds 0.15 μm. First, a substrate having metal layers thereon is provided, with a plurality of gaps formed therebetween. Next, a dielectric layer is formed by simultaneous deposition and ion-bombardment, such that the dielectric layer covers the bottom dielectric liner and fills the gaps. Finally, a top dielectric liner is formed on the dielectric layer by deposition without ion-bombardment.

In accordance with the present invention, before forming the dielectric layer, a bottom dielectric liner can further be conformally formed on the metal layers and in the gaps by deposition without ion-bombardment. The dielectric layer can be formed by high density plasma chemical vapor deposition (HDPCVD). As well, the top dielectric liner can be formed by chemical vapor deposition (CVD).

To achieve the above objects, the present invention further provides a stacked dielectric layer for suppressing electrostatic charge buildup, suitable for a substrate having metal layers thereon, with a plurality of gaps formed therebetween. The stacked dielectric layer comprises a dielectric layer and a top dielectric liner when the pitch of each gap exceeds 0.15 μm. The metal layers are deposited on the substrate, with a plurality of gaps formed therebetween. The dielectric layer is formed by deposition with ion-bombardment to cover the metal layers and fill the gaps. As well, a top dielectric liner is formed on the dielectric layer by deposition without ion-bombardment.

In accordance with the present invention, the stacked dielectric layer further comprises a bottom dielectric liner formed conformally on the metal layers and in the gaps by deposition without ion-bombardment, such as sub-atmospheric pressure thermal chemical vapor deposition (SACVD), atmospheric pressure chemical vapor deposition (APCVD), low pressure chemical vapor deposition (LPCVD), plasma enhanced chemical vapor deposition (PECVD) without ion-bombardment, or high density plasma chemical vapor deposition (HDPCVD) without ion-bombardment. The thickness of the bottom dielectric liner comprising silicon oxide can be about 200~400 Å.

In accordance with the present invention, the dielectric layer can be deposited by high density plasma chemical deposition (HDPCVD) with ion-bombardment. The thickness of the dielectric layer comprising silicon oxide can be about 3000~15000 Å.

In accordance with the present invention, the top dielectric liner can be formed by sub-atmospheric pressure thermal chemical vapor deposition (SACVD), atmospheric pressure chemical vapor deposition (APCVD), low pressure chemical vapor deposition (LPCVD), plasma enhanced chemical vapor deposition (PECVD) without ions bombardment, or high density plasma chemical vapor deposition (HDPCVD) without ions bombardment. The thickness of the top dielectric liner comprising silicon oxide can be about 400~600 Å.

The present invention also provides another stacked dielectric layer comprising a substrate, a patterned metal layer, deposited on the substrate, with a plurality of gaps formed therebetween, and a dielectric layer formed on the metal layers and filled the gaps, wherein the dielectric layer is subjected to a low-power plasma treatment to suppress electrostatic charge buildup.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

First Embodiment

Figure 1:
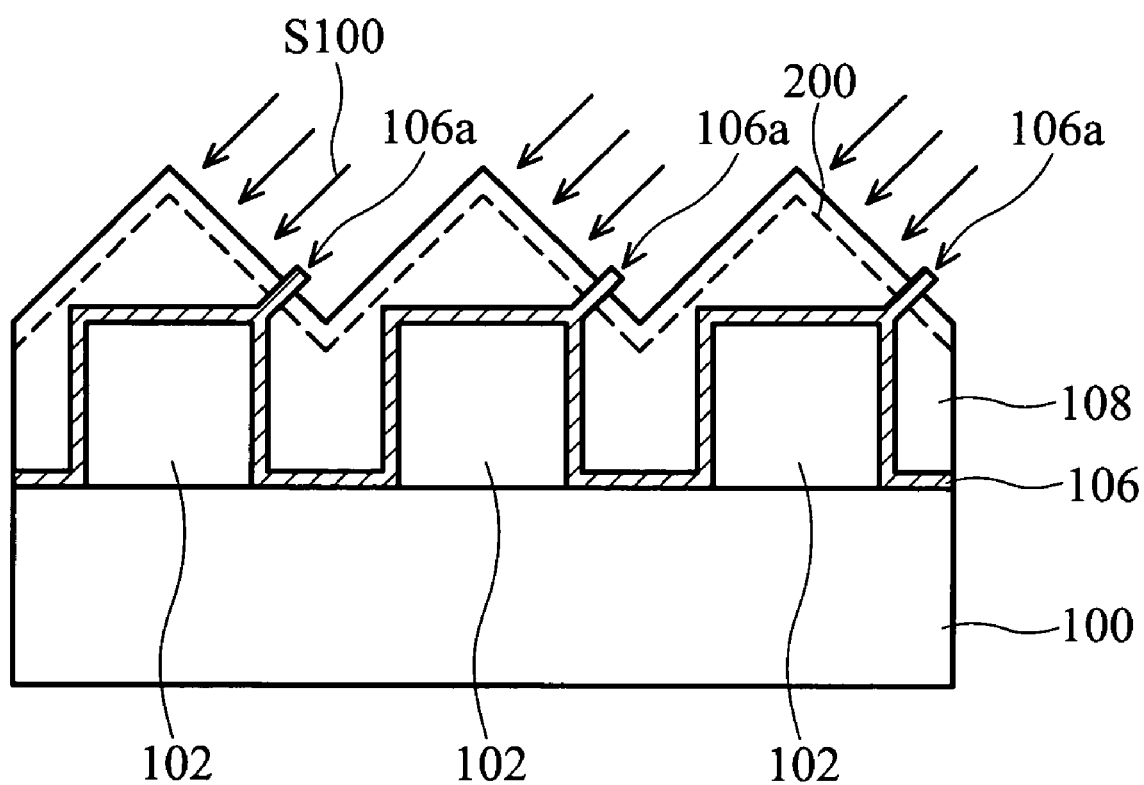
FIG. 1 is a is a cross-section illustrating the metal extrusion of the prior art.
Figure 2A:
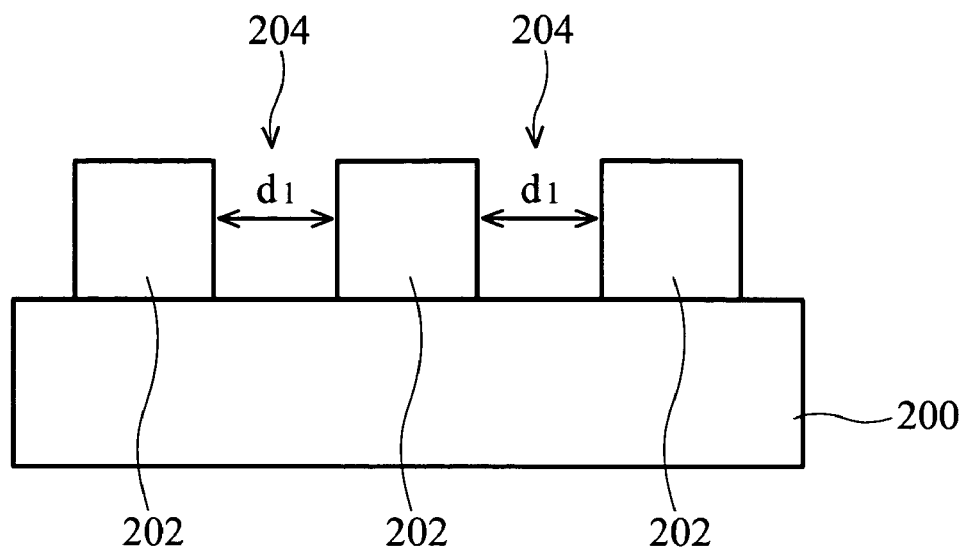
FIG. 2A through 2D are cross-sections showing the method of fabricating a stacked dielectric layer for suppressing electrostatic charge buildup according to one embodiment of the invention.

First, in FIG. 2A, a substrate 200 having metal layers 202 thereon is provided, wherein a plurality of gaps 204 are formed between the metal layers 202 on the substrate 200. The substrate 200 is understood to possibly contain MOS transistors, resistors, logic devices, and the like, though they are omitted from the drawings for the sake of clarity. In the following, the term "substrate" is meant to include devices formed within a semiconductor wafer and the layers overlying the wafer. The term "substrate surface" is meant to include the uppermost exposed layers on a semiconductor wafer, such as a Si wafer surface, an insulating layer and metal wires. The metal layers 202 may comprise Cu, Al, or Cu/Al alloy. Herein, the choices for pitch $d_1$ of each gap are unlimited, and can exceed 0.15 μm.

Figure 2B:
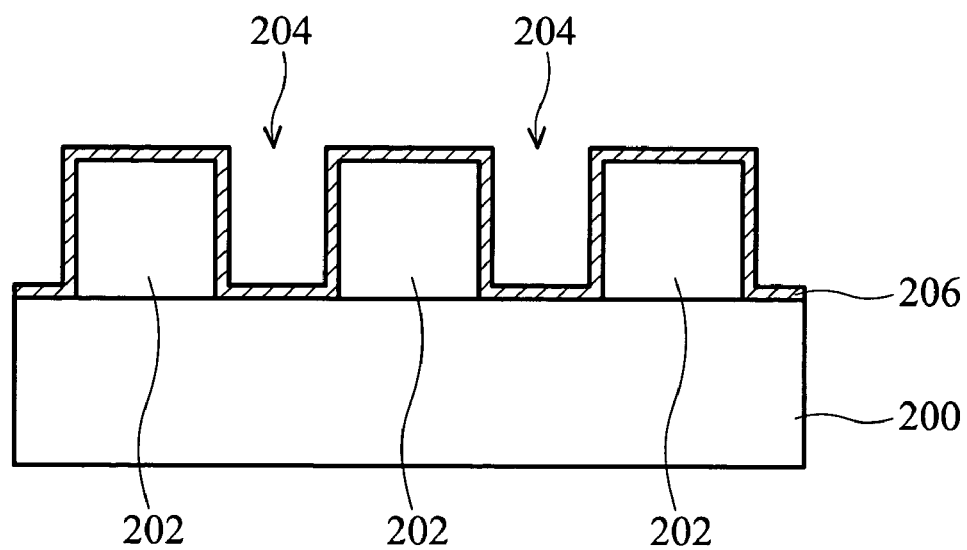

Next, in FIG. 2B, a bottom dielectric liner 206 can further be conformally formed on the metal layers 202 and in the gaps 204 by deposition without ion-bombardment. The bottom dielectric liner 206 can be deposited by sub-atmospheric pressure thermal chemical vapor deposition (SACVD), atmospheric pressure chemical vapor deposition (APCVD), low pressure chemical vapor deposition (LPCVD), plasma enhanced chemical vapor deposition (PECVD) without ion-bombardment, or high density plasma chemical vapor deposition (HDPCVD) without ion-bombardment. High density plasma chemical vapor deposition (HDPCVD) without ion-bombardment is preferably applied. Usually, in high density plasma chemical vapor (HDPCVD), deposition and ion-bombardment, with Ar or He, etching the sidewalls of the gaps are performed at the same time to enhance gap-filling properties. In the embodiment of the present invention, the bottom dielectric liner 206 is preferably deposited employing high density plasma chemical vapor (HDPCVD) without supplying a bias power for ion-bombardment. The thickness of the bottom dielectric liner 206 comprising silicon oxide is preferably about 200~400 Å.

Figure 2C:
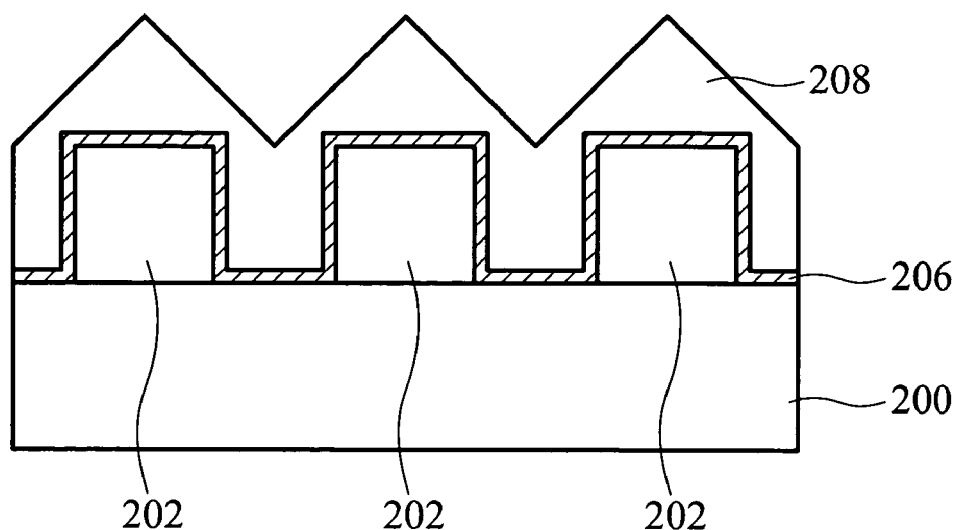

In FIG. 2C, a dielectric layer 208 can be formed by simultaneous deposition and ion-bombardment, such that the dielectric layer 208 covers the bottom dielectric liner 206 and fills gaps 204. The dielectric layer 208 is preferably formed by high density plasma chemical vapor deposition (HDPCVD). During deposition, a bias power of about 2000~4500 W is preferably applied to provide ion-bombardment so as to etch the depositing film on the sidewall of the gaps 204. Thus, the depositing film is formed vertically to fill the gaps 204. The gap-filling properties of the dielectric layer 208 are optimal. High density plasma chemical vapor deposition (HDPCVD) is preferably performed employing a source power of about 2000~4500 W using precursors comprising saline and oxygen at a temperature of about 200~700° C. under a pressure of about 0~1 torr. A number of charges, such as fixed charges, defect charges, or dangling bonds, are produced in the dielectric layer 208, due to residual bombardment ions and interrupted bonds of the dielectric layer 208 caused by ion-bombardment.

Figure 2D:
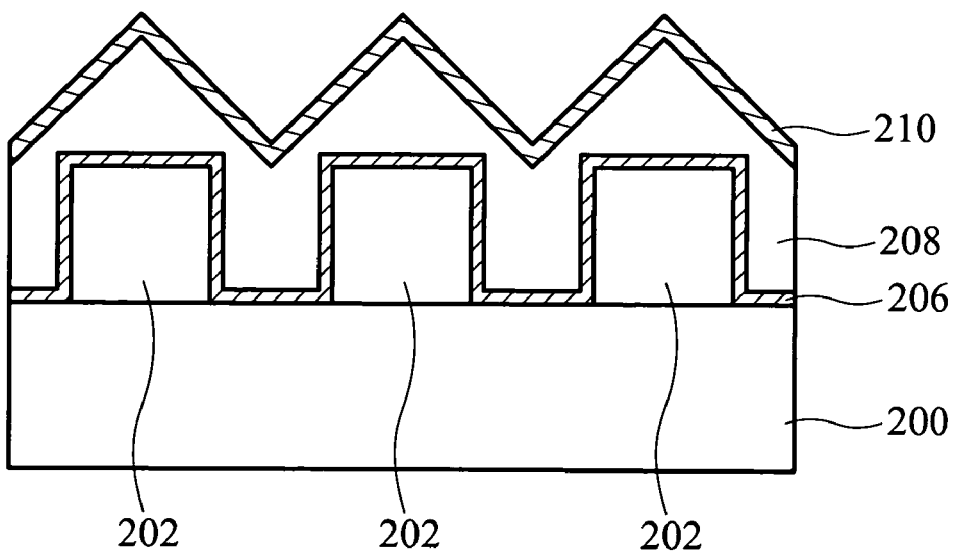

In FIG. 2D, a top dielectric liner 210 is formed comformally on the dielectric layer 208 by deposition without ion-bombardment. The top dielectric liner 210 can be formed by sub-atmospheric pressure thermal chemical vapor deposition (SACVD), atmospheric pressure chemical vapor deposition (APCVD), low pressure chemical vapor deposition (LPCVD), plasma enhanced chemical vapor deposition (PECVD) without ion-bombardment, or high density plasma chemical vapor deposition (HDPCVD) without ion-bombardment. The top dielectric liner 210 is preferably deposited employing high density plasma chemical vapor (HDPCVD) without bias power for ion-bombardment to avoid fixed charges, defect charges, and dangling bonds. In the embodiment of the present invention, high density plasma chemical vapor deposition (HDPCVD) is preferably employed to in-situ deposit the bottom dielectric layer 206, the dielectric layer 208, and the top dielectric liner 210 by controlling supply of the bias power. The thickness of the top dielectric liner 210 comprising silicon oxide is about 400~600 Å.

According to the present invention, the stacked dielectric layer, is applied on a substrate 200 having metal layers 202 thereon, a plurality of gaps 204 formed between the metal layers 202 on the substrate 200. The stacked dielectric according to the present invention comprises a bottom dielectric liner 206, a dielectric layer 208, and a top dielectric liner 210. The bottom dielectric liner 206 can further be conformally formed on the metal layers 202 and in the gaps 204. The dielectric layer 208 is formed by deposition with ion-bombardment to cover the bottom dielectric liner 206 and fill the gaps. As well, a top dielectric liner 210 is formed on the dielectric layer 208 by deposition without ion-bombardment.

Finally, the stacked dielectric layer according to the present invention is preferably cleaned by water scrubbing. A jet scrubber equipment can applie distilled water to the stacked dielectric layer to remove particles from the surface thereof, incident at about 3~6°. Since the stacked dielectric comprises the top dielectric liner 210 without a large number of electrostatic charges, the top dielectric liner can effectively suppresses electrostatic charges buildup during subsequent water scrubbing, and thus metal extrusion is avoided.

The present embodiment provides several advantages as described below. First, the stacked dielectric comprising the dielectric layer 208 deposited by high density plasma chemical vapor deposition (HDPCVD) has optimal gap-filling properties. Second, the stacked dielectric comprising the top dielectric liner 210 without fixed charges, defect charges, and dangling bonds effectively suppresses electrostatic charges during subsequent water scrubbing, thus metal extrusion is avoided. Third, the bottom dielectric liner 206, the dielectric layer 208, and the top dielectric liner 210 can be in-situ deposited in a high density plasma chemical vapor deposition (HDPCVD) chamber by controlling the supply of bias power for ion-bombardment.

However, when semiconductor manufacturing generation is reduced to 0.15 μm, the total dielectric coefficient of the stacked dielectric layer according to the first embodiment can be not low enough to improve RC delay, due to the additional top dielectric liner 210. Therefore, the present invention provides another method of fabricating a stacked dielectric layer for suppressing electrostatic charge buildup, as further disclosed herein.

Second Embodiment

Figure 3A:
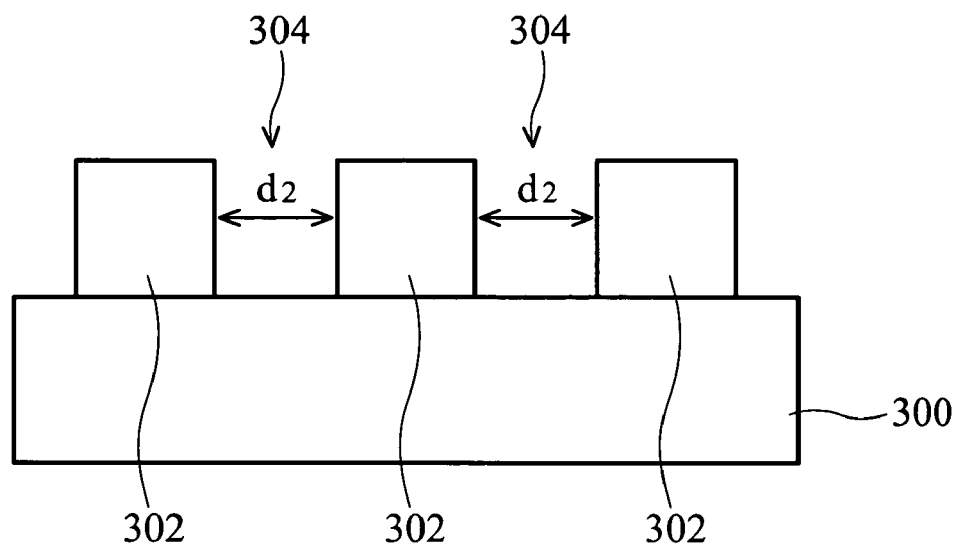
FIG. 3A through 3D are cross-sections showing the method of fabricating a stacked dielectric layer for suppressing electrostatic charge buildup according to another embodiment of the invention.

First, in FIG. 3A, a substrate 300 having metal layers 302 thereon is provided, with a plurality of gaps 304 formed therebetween. The substrate 300 can comprise desired elements, such as a MOS transistor, capacitor, or a logic device, although these elements are not shown in order to simplify the explanation. The metal layers 302 comprise Cu, Al, And Cu/Al alloy. Herein, the choices for pitch $d_2$ of each gap are unlimited, and can be less than 0.15 μm.

Figure 3B:
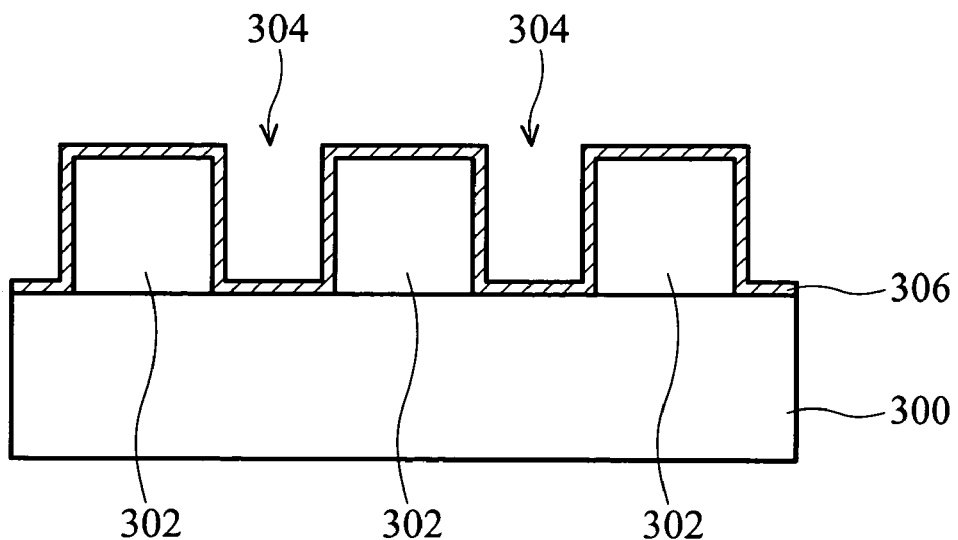

Next, in FIG. 3B, a bottom dielectric liner 306 can be conformally formed on the metal layers 302 and in the gaps 304 by deposition without ion-bombardment. The bottom dielectric liner 306 can be deposited by chemical vapor deposition (CVD). Usually, in high density plasma chemical vapor (HDPCVD), deposition and ion-bombardment with Ar or He, etching the sidewalls of the gaps, are performed at the same time to enhance gap-filling properties. In the embodiment of the present invention, the bottom dielectric liner 306 is preferably deposited employing high density plasma chemical vapor (HDPCVD) without supplying bias power for ion-bombardment. The thickness of the bottom dielectric liner 306 comprising silicon oxide is preferably about 200~400 Å.

Figure 3C:
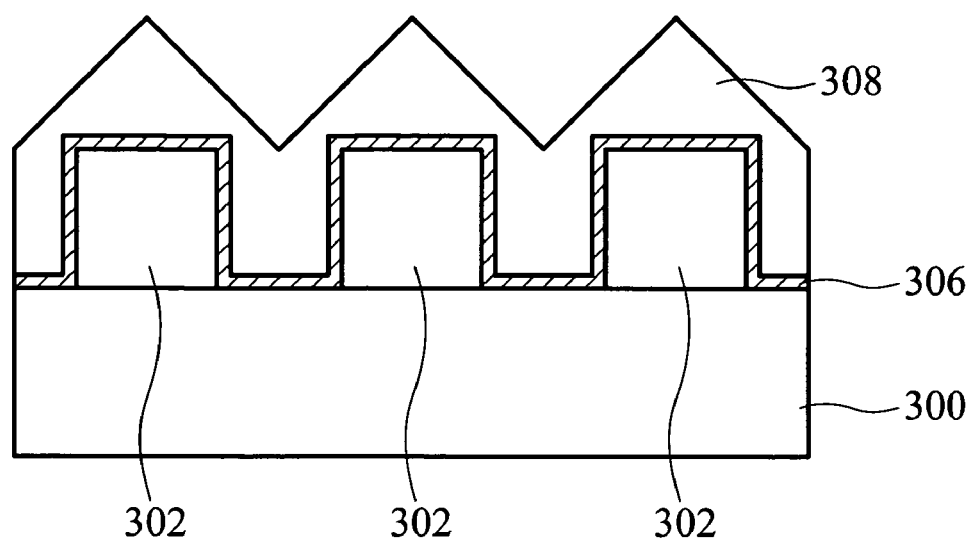

In FIG. 3C, a dielectric layer 308 is formed to cover the metal layers 302 and fill the gaps 304. The dielectric layer 308 comprises fluorinated silica glass (FSG). The dielectric layer 308 is preferably formed by high density plasma chemical vapor deposition (HDPCVD). During deposition, a bias power of about 2000~4500 W is preferably applied to provide ion-bombardment to etch the depositing film on the sidewall of the gaps 304. Thus, the depositing film is generally formed vertically to fill the gaps 304. The gap-filling properties of the dielectric layer 308 are optimal. High density plasma chemical vapor deposition (HDPCVD) is preferably performed employing a source power of about 2000~4500 W and using precursors comprising saline and oxygen at a temperature of about 200~700° C. under a pressure of about 0~1 torr. A number of charges, such as fixed charges, defect charges, or dangling bonds, are usually produced in the dielectric layer 308, due to residual bombardment ions and interrupted bonds of the dielectric layer 308 caused by ion-bombardment.

Figure 3D:
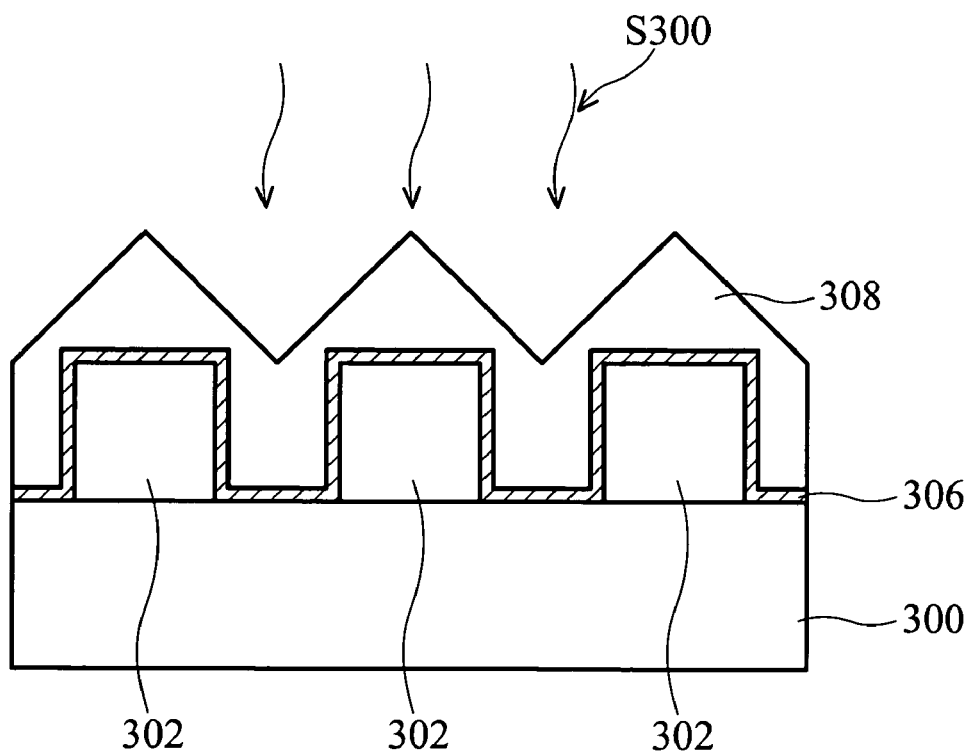

In FIG. 3D, a plasma treatment S300, such as low power plasma treatment, is performed on the dielectric layer 308 to implant charges (comprising positive or negative charges) and/or ions (comprising positive or negative), resulting in neutralizing or discharge the charges, caused by ion-bombardment, in the dielectric layer 308. Preferably, ions (comprising positive or negative) is implanted. The low power plasma treatment S300 can comprise nitrogen, oxygen, nitrous oxide, helium, neon, argon, krypton, xenon, or radon plasma treatment at a flow rate of about 300~500 sccm. The plasma treatment S300 can be applied by a source power of about 20~500 W, a bias power of about 0~500 W at a chamber pressure of about 2~10 torr for about 5~60 seconds. Preferably, the source power is about 50 W. After the low power plasma treatment S300, charges in the dielectric layer 308 can be entirely neutralized.

Finally, the stacked dielectric layer according to the present invention is cleaned by water scrubbing with a jet scrubber equipment to remove particles from the surface of the stacked dielectric layer. Since the charges in the dielectric layer 308 is entirely neutralized by the low power plasma treatment S300, the electrostatic charges buildup of the dielectric layer 308 is suppressed during subsequent water scrubbing. Accordingly, the electrostatic charges can be reduced from about −73V to about −1V at a measured source power of 50 W, and thus metal extrusion from electrostatic charges is avoided.

According to the present embodiment, the plasma treatment S300 is employed to solve metal extrusion caused by electrostatic charges induced by friction between water and the dielectric layer during water scrubbing for removing particles from the surface of the dielectric layer. Additionally, this embodiment provides a dielectric coefficient of the stacked dielectric layer low enough to improve RC delay.

In addition, according to the present invention, the plasma treatment S300 can also be performed on the dielectric layer 308 for suppressing electrostatic charge buildup, after removing particles from the surface of the dielectric layer by water scrubbing.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a stacked dielectric layer for suppressing electrostatic charge buildup, comprising:
    providing a substrate having metal layers thereon, with a plurality of gaps formed therebetween;
    covering the metal layers and filling the gaps with a dielectric layer comprising ions or charges of a first polarity therein; and
    implanting ions or charges of a second polarity opposite to the first polarity in the dielectric layer.

2. The method as claimed in claim 1, wherein the pitch of each gap is less than 0.15μm.

3. The method as claimed in claim 1, wherein the dielectric layer comprises fluorinated silica glass (FSG).

4. The method as claimed in claim 1, further comprising, before or after implanting ions or charges in the dielectric layer, removing particles from the surface of the dielectric layer by water scrubbing.

5. The method as claimed in claim 1, wherein the dielectric layer is implanted with ions or charges by a plasma treatment.

6. The method as claimed in claim 5, wherein the plasma treatment comprises nitrogen, oxygen, nitrous oxide, helium, neon, argon, krypton, xenon, or radon plasma treatment at a flow rate of about 300~500 sccm.

7. The method as claimed in claim 5, wherein the plasma treatment is applied by a source power of about 20~500 W and a bias power of about 0~500 W at a chamber pressure of about 2~10torr for about 5~60 seconds.

8. A stacked dielectric layer for suppressing electrostatic charge buildup, formed by the method as claimed in claim 1.

* * * * *